(12) United States Patent
Ikeda et al.

(10) Patent No.: US 8,241,700 B2
(45) Date of Patent: Aug. 14, 2012

(54) DEPOSITION METHOD AND MANUFACTURING METHOD OF LIGHT-EMITTING DEVICE

(75) Inventors: Hisao Ikeda, Kanagawa (JP); Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 427 days.

(21) Appl. No.: 12/635,048

(22) Filed: Dec. 10, 2009

(65) Prior Publication Data

US 2010/0151762 A1 Jun. 17, 2010

(30) Foreign Application Priority Data

Dec. 15, 2008 (JP) ................... 2008-318365

(51) Int. Cl.
*B05D 5/12* (2006.01)
*B05D 5/06* (2006.01)
*B05D 5/00* (2006.01)
*B41M 3/12* (2006.01)
*C23C 14/30* (2006.01)
*H05B 7/00* (2006.01)

(52) U.S. Cl. .......... 427/66; 427/146; 427/256; 427/287; 427/596

(58) Field of Classification Search ............ 427/146, 427/596, 256, 287
See application file for complete search history.

(56) References Cited

U.S. PATENT DOCUMENTS

| | | |
|---|---|---|
| 5,937,272 A | 8/1999 | Tang |
| 6,165,543 A | 12/2000 | Otsuki et al. |
| 6,283,060 B1 | 9/2001 | Yamazaki et al. |
| 6,689,492 B1 | 2/2004 | Yamazaki et al. |
| 6,703,179 B2 | 3/2004 | Tyan |
| 6,776,847 B2 | 8/2004 | Yamazaki et al. |
| 7,316,983 B2 | 1/2008 | Yamazaki et al. |
| 8,153,201 B2 | 4/2012 | Aoyama et al. |
| 2003/0134488 A1 | 7/2003 | Yamazaki et al. |

(Continued)

FOREIGN PATENT DOCUMENTS

JP 2000-256877 9/2000

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

*Primary Examiner* — Michael Cleveland
*Assistant Examiner* — Austin Murata
(74) *Attorney, Agent, or Firm* — Husch Blackwell LLP (57) ABSTRACT

An object is to provide a deposition method in which an organic material layer which is a material of a common layer is evenly formed over an entire surface of a donor substrate (a first substrate) and can be transferred to an element formation substrate (a second substrate) as transfer layers which are common layers for red (R), green (G), and blue (B) with different thicknesses. An organic material layer over a first absorption layer and a second absorption layer is deposited to a second substrate as a first transfer layer and a second transfer layer by sublimating the organic material layer over the first substrate. The thicknesses of the first and second transfer layers differ in accordance with the ratio of the area of the first absorption layer to the area of the second absorption layer.

18 Claims, 4 Drawing Sheets

U.S. PATENT DOCUMENTS

| | | |
|---|---|---|
| 2004/0065902 A1 | 4/2004 | Yamazaki et al. |
| 2005/0005848 A1 | 1/2005 | Yamazaki et al. |
| 2005/0145326 A1 | 7/2005 | Hatwar |
| 2006/0243377 A1 | 11/2006 | Matsuo et al. |
| 2006/0246240 A1* | 11/2006 | Matsuda et al. ........... 428/32.39 |
| 2007/0029554 A1 | 2/2007 | Nakamura et al. |
| 2008/0081115 A1 | 4/2008 | Yamazaki et al. |
| 2008/0113292 A1* | 5/2008 | Matsuo ...................... 430/270.1 |
| 2008/0299496 A1 | 12/2008 | Hirakata et al. |
| 2009/0075214 A1 | 3/2009 | Hirakata et al. |
| 2009/0104403 A1 | 4/2009 | Aoyama et al. |
| 2009/0104835 A1 | 4/2009 | Aoyama et al. |
| 2009/0111248 A1 | 4/2009 | Ohnuma et al. |
| 2010/0123160 A1 | 5/2010 | Hatano et al. |

FOREIGN PATENT DOCUMENTS

| | | |
|---|---|---|
| JP | 2003-258211 | 9/2003 |
| JP | 2003-313654 | 11/2003 |
| JP | 2004-103406 | 4/2004 |
| JP | 2006-309995 | 11/2006 |
| JP | 2006-344459 | 12/2006 |
| WO | WO 2005/069398 A2 | 7/2005 |

* cited by examiner

DEPOSITION METHOD AND MANUFACTURING METHOD OF LIGHT-EMITTING DEVICE

BACKGROUND OF THE INVENTION

1. Field of the Invention

The invention disclosed in this specification relates to a deposition method and a manufacturing method of a light-emitting device.

2. Description of the Related Art

A solar cell, a light-emitting element, an organic transistor, and the like can be given as examples of electronics devices that include an organic compound as a functional organic material. These devices take advantage of electrical properties and optical properties of the organic compound. Among them, a light-emitting element has been making particularly remarkable development.

One of methods for manufacturing full-color panels is a selective formation method in which light-emitting layers for red (R), green (G), and blue (B) are formed as selected. This selective formation method is generally performed using a high-definition metal mask; recently, a method in which a light-emitting layer of a light-emitting element is formed by laser thermal transfer has been proposed (see Reference 1).

In the selective formation method, light-emitting layers whose materials differ depending on color are generally formed as selected. Hole transport layers, electron transport layers, or the like which are formed of the same material for every colors are often formed at a time. Therefore, the hole transport layers or the like for all colors have the same thickness.

There is an optimum thickness of the hole transport layer or the like for each color, and it is necessary to change the thickness for each color in order to improve the performance of a light-emitting element.

However, in the case where a common layer such as a hole transport layer or the like is also formed as selected for each color, a manufacturing process requires a much longer period of time and yield is reduced.

[Reference 1] Japanese Published Patent Application No. 2006-309995

SUMMARY OF THE INVENTION

Thus, it is an object of the invention disclosed in this specification to provide a deposition method in which an organic material layer which is a material of a common layer such as a hole transport layer or the like is evenly formed over an entire surface of a donor substrate and the organic material layer can be transferred to an element formation substrate as transfer layers which are common layers for red (R), green (G), and blue (B) with different thicknesses.

An organic material which is a material of a common layer is formed over a donor substrate and irradiated with light such as a laser beam, whereby the organic material over the donor substrate is sublimated and the sublimated organic material is deposited to a deposition substrate. Here, a mask layer including an absorption layer and a reflection layer is provided for one pixel, between the organic material and a surface of the donor substrate which is irradiated with light.

By being irradiated with light such as a laser beam, the absorption layer is heated and only a portion of the organic material which is located over the absorption layer is heated and sublimated. Accordingly, only the portion of the organic material which is located over the absorption layer is deposited to the deposition substrate.

On the other hand, the reflection layer reflects light such as a laser beam. Therefore, the organic material is not heated.

The thickness of a film to be deposited can be controlled by changing the ratio of the area of the reflection layer to the overall area of the reflection layer and the absorption layer.

The invention relates to a deposition method including the steps of: forming a first mask layer including a first absorption layer and a first reflection layer and a second mask layer including a second absorption layer and a second reflection layer over a first substrate; forming an organic material layer over the first mask layer and the second mask layer; disposing the organic material layer of the first substrate and a deposition surface of a second substrate so as to face each other; sublimating the organic material layer over the first absorption layer and the second absorption layer by irradiation with light from a side of the first substrate which is opposite to a side on which the organic material layer is formed; and depositing a first transfer layer to a first pixel corresponding to the first mask layer and a second transfer layer to a second pixel corresponding to the second mask layer, over the second substrate by sublimating the organic material layer over the first absorption layer and the second absorption layer. The thickness of the first transfer layer and the thickness of the second transfer layer differ in accordance with the ratio of the area of the first absorption layer to the area of the second absorption layer.

The invention relates to a deposition method including the steps of: forming an organic material layer over a first substrate having a first mask layer including a first absorption layer and a first reflection layer and a second mask layer including a second absorption layer and a second reflection layer, where the first absorption layer and the second absorption layer have different areas; disposing the organic material layer of the first substrate and a deposition surface of a second substrate so as to face each other; sublimating the organic material layer over the first absorption layer and the second absorption layer by irradiation with light from a side of the first substrate which is opposite to a side on which the organic material layer is formed; and depositing a first transfer layer to a first pixel corresponding to the first mask layer and a second transfer layer to a second pixel corresponding to the second mask layer, over the second substrate by sublimating the organic material layer over the first absorption layer and the second absorption layer. The thickness of the first transfer layer and the thickness of the second transfer layer differ in accordance with the ratio of the area of the first absorption layer to the area of the second absorption layer.

The invention relates to a deposition method including the steps of: disposing a first substrate having a first mask layer including a first absorption layer and a first reflection layer and a second mask layer including a second absorption layer and a second reflection layer and a deposition surface of a second substrate so as to face each other, where the first absorption layer and the second absorption layer have different areas and an organic material layer is formed over the first mask layer and the second mask layer; sublimating the organic material layer over the first absorption layer and the second absorption layer by irradiation with light from a side of the first substrate which is opposite to a side on which the organic material layer is formed; and depositing a first transfer layer to a first pixel corresponding to the first mask layer and a second transfer layer to a second pixel corresponding to the second mask layer, over the second substrate by sublimating the organic material layer over the first absorption layer and the second absorption layer. The thickness of the first transfer layer and the thickness of the second transfer layer differ in accordance with the ratio of the area of the first absorption layer to the area of the second absorption layer.

The invention relates to a method for manufacturing a light-emitting device, including the steps of: forming a first mask layer including a first absorption layer and a first reflection layer and a second mask layer including a second absorption layer and a second reflection layer over a first substrate; forming an organic material layer over the first mask layer and the second mask layer; disposing the organic material layer of the first substrate and a deposition surface of a second substrate provided with a first electrode which is one of an anode and a cathode so as to face each other; sublimating the organic material layer over the first absorption layer and the second absorption layer by irradiation with light from a side of the first substrate which is opposite to a side on which the organic material layer is formed; depositing a first transfer layer to a first pixel corresponding to the first mask layer and a second transfer layer to a second pixel corresponding to the second mask layer, over the second substrate by sublimating the organic material layer over the first absorption layer and the second absorption layer; forming a light-emitting layer; and forming a second electrode which is the other of the anode and the cathode. The thickness of the first transfer layer and the thickness of the second transfer layer differ in accordance with the ratio of the area of the first absorption layer to the area of the second absorption layer.

The invention relates to a method for manufacturing a light-emitting device, including the steps of: forming an organic material layer over a first substrate having a first mask layer including a first absorption layer and a first reflection layer and a second mask layer including a second absorption layer and a second reflection layer, where the first absorption layer and the second absorption layer have different areas; disposing the organic material layer of the first substrate and a deposition surface of a second substrate provided with a first electrode which is one of an anode and a cathode so as to face each other; sublimating the organic material layer over the first absorption layer and the second absorption layer by irradiation with light from a side of the first substrate which is opposite to a side on which the organic material layer is formed; depositing a first transfer layer to a first pixel corresponding to the first mask layer and a second transfer layer to a second pixel corresponding to the second mask layer, over the second substrate by sublimating the organic material layer over the first absorption layer and the second absorption layer; forming a light-emitting layer; and forming a second electrode which is the other of the anode and the cathode. The thickness of the first transfer layer and the thickness of the second transfer layer differ in accordance with the ratio of the area of the first absorption layer to the area of the second absorption layer.

The invention relates to a method for manufacturing a light-emitting device, including the steps of: disposing a first substrate having a first mask layer including a first absorption layer and a first reflection layer and a second mask layer including a second absorption layer and a second reflection layer and a deposition surface of a second substrate provided with a first electrode which is one of an anode and a cathode so as to face each other, where the first absorption layer and the second absorption layer have different areas and an organic material layer is formed over the first mask layer and the second mask layer; sublimating the organic material layer over the first absorption layer and the second absorption layer by irradiation with light from a side of the first substrate which is opposite to a side on which the organic material layer is formed; depositing a first transfer layer to a first pixel corresponding to the first mask layer and a second transfer layer to a second pixel corresponding to the second mask layer, over the second substrate by sublimating the organic material layer over the first absorption layer and the second absorption layer; forming a light-emitting layer; and forming a second electrode which is the other of the anode and the cathode. The thickness of the first transfer layer and the thickness of the second transfer layer differ in accordance with the ratio of the area of the first absorption layer to the area of the second absorption layer.

Each of the first absorption layer and the second absorption layer may be formed of a single material selected from molybdenum, tantalum nitride, titanium, tungsten, and carbon.

Each of the first reflection layer and the second reflection layer may be formed of a single material selected from aluminum, silver, gold, platinum, copper, an alloy including aluminum, and an alloy including silver.

The light may be a laser beam.

The thickness of a common layer for each of pixels for red (R), green (G), and blue (B) can be easily changed.

DETAILED DESCRIPTION OF THE INVENTION

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the invention disclosed in this specification should not be interpreted as being limited to the description in the embodiments. Note that in the accompanying drawings, the same portions or portions having similar functions are denoted by the same reference numerals, and repetitive description thereof is omitted.

Note that in this specification, a semiconductor device refers to an element or a device in general which functions by utilizing a semiconductor. Electric devices including electronic circuits, liquid crystal display devices, light-emitting devices, and the like and electronic devices on which the electric devices are mounted are included in the category of semiconductor devices.

[Embodiment 1]

This embodiment is described with reference to FIGS. 1A to 1C, FIG. 2, FIGS. 3A and 3B, and FIGS. 4A to 4C.

First, a method for controlling the thickness of a film to be transferred to a deposition substrate with the use of an absorption layer and a reflection layer by a photo thermal transfer method is described with reference to FIGS. 1A to 1C and FIG. 2.

A mask layer 105 including an absorption layer 103 which absorbs light and a reflection layer 104 which reflects light is formed over a substrate 101, and an organic material layer 106 is formed over the mask layer 105. The substrate 101, the absorption layer 103, the reflection layer 104, and the organic material layer 106 are collectively called a donor substrate 107. In addition, a substrate 111 which is a deposition substrate is disposed so as to face a side of the substrate 101 on which the organic material layer 106 is formed (see FIG. 1A). The distance between the donor substrate 107 and the substrate 111 is denoted by TS.

Figure 1A:
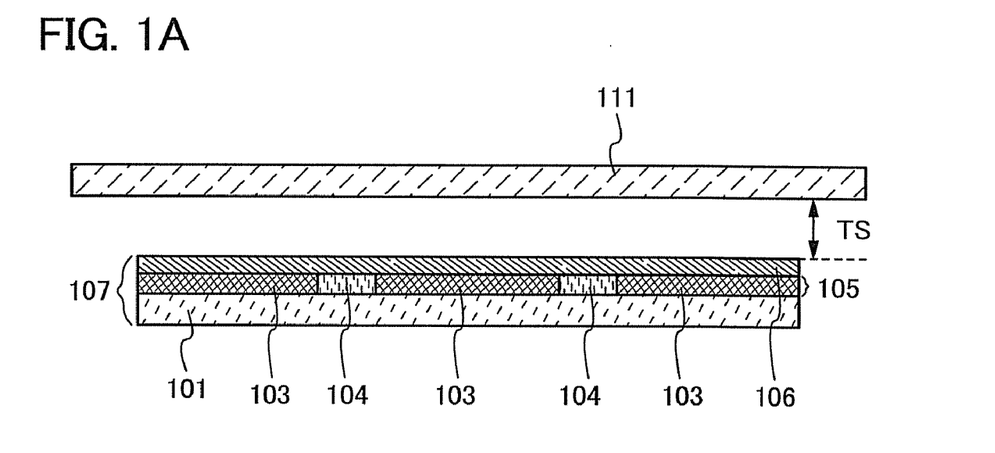
FIGS. 1A to 1C are cross-sectional views illustrating a deposition method.

The substrate 101 is a supporting substrate for the reflection layer 104, the absorption layer 103, and the like and transmits irradiation light used for evaporating the organic material layer 106. Therefore, the substrate 101 preferably has high light transmittance.

Specifically, when lamp light or laser light is used for evaporating the organic material layer 106, a substrate that transmits the light is preferably used as the substrate 101. As the substrate 101, a glass substrate, a quartz substrate, a plastic substrate containing an inorganic material, or the like can be used, for example.

The absorption layer 103 absorbs irradiation light used for evaporating the organic material layer 106. It is preferable that the absorption layer 103 has low reflectance, low transmittance, and high absorptance for the irradiation light. Specifically, the absorption layer 103 preferably has a reflectance of 60% or less for the irradiation light. In addition, it is preferable that the absorption layer 103 have an absorptance of 40% or more for the irradiation light.

Therefore, it is preferable that the absorption layer 103 be formed of a material having low reflectance and high absorptance for the irradiation light. It is also preferable that the absorption layer 103 be formed of a material having high heat resistance. For example, molybdenum, tantalum nitride, titanium, tungsten, carbon, or the like can be used.

The absorption layer 103 can be formed using any of various kinds of methods. For example, the absorption layer 103 can be fanned by a sputtering method using a target of molybdenum, tantalum, titanium, tungsten, carbon, an alloy thereof, or the like. In addition, the absorption layer 103 is not limited to a single layer and may include a plurality of layers.

Note that the absorption layer 103 may partially transmit the irradiation light as long as it generates heat to the sublimation temperature of the organic material layer 106. When the absorption layer 103 partially transmits the irradiation light, a material which does not decompose even when irradiated with the light is preferably used for the organic material layer 106.

The reflection layer 104 reflects irradiation light used for evaporating the organic material layer 106. The reflection layer 104 preferably has a reflectance of 85% or more, more preferably, a reflectance of 90% or more, for the irradiation light.

Therefore, it is preferable that the reflection layer 104 be formed of a material having high reflectance for the irradiation light. For example, aluminum, silver, gold, platinum, copper, an alloy containing aluminum, an alloy containing silver, or the like can be used.

In particular, an aluminum-titanium alloy, an aluminum-neodymium alloy, or a silver-neodymium alloy has high reflectance for light in the infrared region (a wavelength of 800 nm or more) and is thus suitably used for the reflection layer 104.

The reflection layer 104 is not limited to a single layer and may include a plurality of layers. For example, a stack of a film formed of a material having high reflectance and a film formed of a material having low thermal conductivity may be used as the reflection layer.

The reflection layer 104 can be formed using any of various kinds of methods. For example, the reflection layer 104 can be formed by a sputtering method, an electron beam evaporation method, a vacuum evaporation method, or the like.

The organic material layer 106 is a layer containing a material to be transferred by sublimation. The organic material layer 106 may contain plural kinds of materials. The organic material layer 106 is formed entirely over a mask layer 105R for red (R), a mask layer 105G for green (G), and a mask layer 105B for blue (B) and does not need to be selectively formed for each color.

The organic material layer 106 is a material layer for a film, such as a carrier injection layer or a carrier transport layer, to be deposited in each of pixels for red (R), green (G), and blue (B).

In the case where electrons are carriers, an electron injection layer and an electron transport layer can be given as examples; in the case where holes are carriers, a hole injection layer and a hole transport layer can be given as examples. Examples of the hole injection layer, the hole transport layer, and the electron transport layer are described below.

The hole injection layer is a layer that contains a material with an excellent hole injection property. The hole injection layer can be formed using any of the following materials: phthalocyanine compounds such as phthalocyanine (abbreviation: $H_2Pc$) and copper phthalocyanine (CuPc); aromatic amine compounds such as 4,4'-bis[N-(4-diphenylaminophenyl)-N-phenylamino]biphenyl (abbreviation: DPAB) and N,N'-bis[4-[bis(3-methylphenyl)amino]phenyl]-N,N'-diphenyl-[1,1'-Biphenyl]-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the hole injection layer, a composite material of a material with an excellent hole transport property which contains an acceptor material can be used. Note that, by using a material with an excellent hole transport property which contains an acceptor material, a material used to form an electrode may be selected regardless of its work function. As the acceptor material, 7,7,8,8-tetracyano-2,3,5,6-tetrafluoroquinodimethane (abbreviation: $F_4$-TCNQ), chloranil, or the like can be used.

As the material with an excellent hole transport property which is used for the composite material, various compounds such as an aromatic amine compound, a carbazole derivative, aromatic hydrocarbon, and a high molecular compound (such as oligomer, dendrimer, or polymer) can be used. Note that an organic compound used for the composite material preferably has an excellent hole transport property. Specifically, a material having a hole mobility of $10^{-6}$ cm$^2$/Vs or higher is preferable. Note that materials other than these materials can also be used as long as they have more excellent hole transport properties than electron transport properties. Specific organic compounds which can be used for the composite material are given below.

For example, the aromatic amine compound is N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-Biphenyl]-4,4'-diamine (abbreviation: DNTPD), 1,3,5-tris[N-(4-diphenylaminophenyl)-N-phenylamino]benzene (abbreviation: DPA3B), or the like.

The carbazole derivative which can be used for the composite material is specifically 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

The carbazole derivative which can be used for the composite material is alternatively 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)-phenyl]-10-phenylanthracene (abbreviation: CzPA), 1,4-bis[4-(N-carbazolyl)phenyl]-2,3,5,6-tetraphenylbenzene, or the like.

The aromatic hydrocarbon which can be used for the composite material is, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, or the like. Alternatively, pentacene, coronene, or the like may be used. In this manner, aromatic hydrocarbon having 14 to 42 carbon atoms and a hole mobility of $1\times10^{-6}$ cm$^2$/Vs or higher is preferably used.

Note that the aromatic hydrocarbon which can be used for the composite material may have a vinyl skeleton. The aromatic hydrocarbon having a vinyl group is, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), or the like.

Moreover, a high molecular compound such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

The hole transport layer is a layer that contains a material with an excellent hole transport property. The material with an excellent hole transport property is, for example, an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB). The materials mentioned here are mainly materials having a hole mobility of $10^{-6}$ cm$^2$/Vs or higher. Note that materials other than these materials can also be used as long as they have more excellent hole transport properties than electron transport properties.

Further, a high molecular compound such as poly(N-vinylcarbazole) (abbreviation: PVK) or poly(4-vinyltriphenylamine) (abbreviation: PVTPA) can also be used for the hole transport layer.

The electron transport layer is a layer that contains a material with an excellent electron transport property. For example, the electron transport layer is a layer including a metal complex or the like having a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex having an oxazole-based or thiazole-based ligand, such as bis[2-(2'-hydroxyphenyl)benzoxazolato]zinc (abbreviation: Zn(BOX)$_2$) or bis[2-(2'-hydroxyphenyl)benzothiazolato]zinc (abbreviation: Zn(BTZ)$_2$), can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here are mainly materials having an electron mobility of $10^{-6}$ cm$^2$/Vs or higher. Note that the electron transport layer may be formed using materials other than those mentioned above as long as the materials have more excellent electron transport properties than hole transport properties.

The organic material layer 106 is formed by any of various kinds of methods. For example, a dry method such as a vacuum evaporation method or a sputtering method can be used. Alternatively, a wet method such as a spin coating method, a spray coating method, an inkjet method, a dip coating method, a casting method, a die coating method, a roll coating method, a blade coating method, a bar coating method, a gravure coating method, or a printing method can be used.

In order to form the organic material layer 106 by a wet method, a desired evaporation material may be dissolved or dispersed in a solvent and the solution or the dispersion may be adjusted. There is no particular limitation on the solvent as long as an evaporation material can be dissolved or dispersed therein and the solvent does not react with the evaporation material.

Examples of the solvent are as follows: halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of these solvents may also be used.

The use of a wet method makes it possible to enhance material use efficiency and to reduce manufacturing cost of a light-emitting device.

The substrate 111 may be a substrate of a material similar to that of the substrate 101 or may be a flexible substrate formed of plastic or the like.

Irradiation with light 108 is performed from the side of the substrate 101 opposite to the side on which the organic material layer 106 is formed. As the light 108, a laser beam, for example, is used for the irradiation (see FIG. 1B). Accordingly, a portion of the organic material layer 106 over the absorption layer 103 is sublimated, whereas a portion of the organic material layer 106 over the reflection layer 104 is not sublimated. Thus, the organic material sublimated from the portion of the organic material layer 106 over the absorption layer 103 is evenly deposited to the substrate 111 as a transfer layer 112 which is a common layer. In order to obtain a uniform film, the distance TS is preferably longer than the width of the reflection layer 104.

Examples of light sources of a laser beam are as follows: a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; and a combination thereof. The use of a solid-state laser that uses a solid as a laser medium is advantageous in that a maintenance-free condition can be maintained for a long time and output is relatively stable.

Although a laser beam is used as the light 108 of this embodiment, a light source of the irradiation light is not limited to lasers, and any of various light sources can be used.

Examples of light sources of light other than laser light are as follows: discharge lamps such as a flash lamp (e.g., a xenon flash lamp and a krypton flash lamp), a xenon lamp, and a metal halide lamp; and exothermic lamps such as a halogen lamp and a tungsten lamp.

It is preferable that light irradiation be performed in a reduced-pressure atmosphere. The reduced-pressure atmosphere can be obtained by evacuation of a deposition chamber with an evacuation unit to a vacuum of about $5\times10^{-3}$ Pa or less, preferably, about $10^{-4}$ Pa to $10^{-6}$ Pa.

Figure 1B:
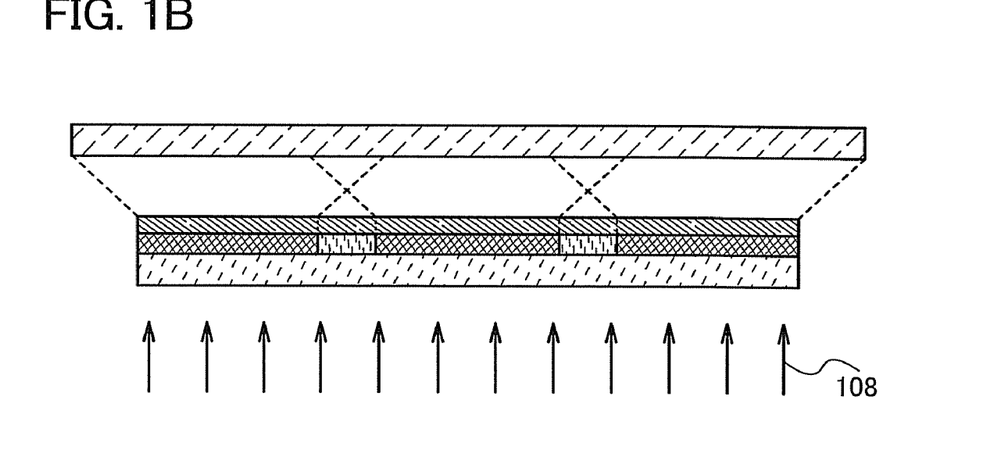
Figure 1C:
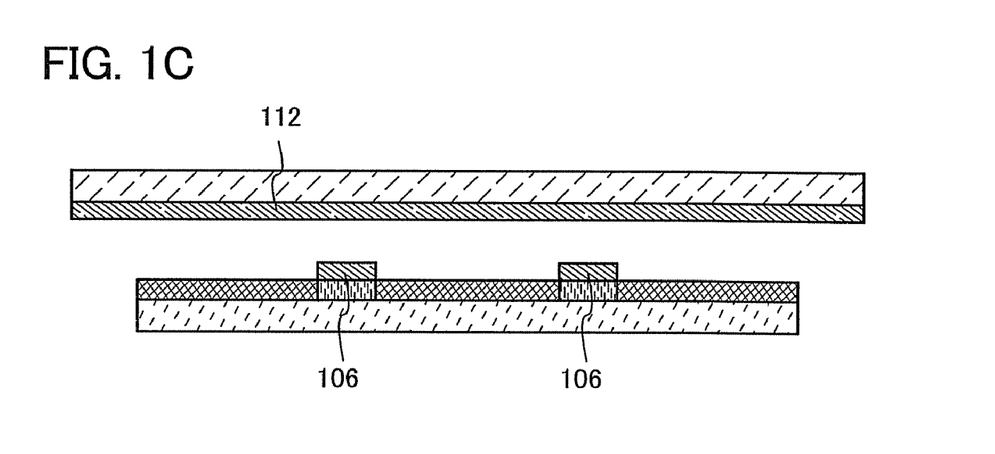

By irradiation with the light 108, for example, a laser beam, the transfer layer 112 with a uniform thickness is formed over the substrate 111, and part of the organic material layer 106 remains over the reflection layer 104 (see FIG. 1C).

Figure 2:
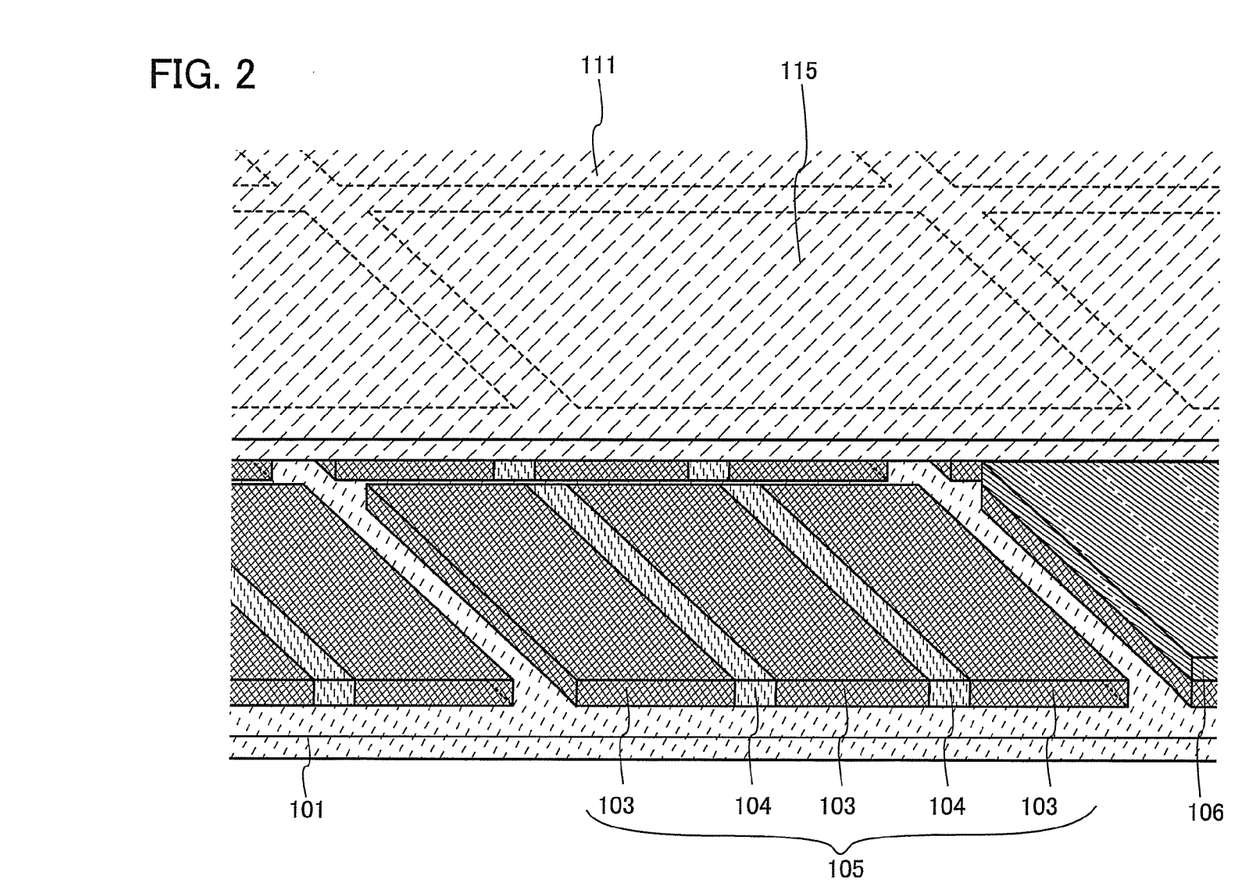
FIG. 2 is a perspective view illustrating a deposition method.

An example where the organic material layer 106 and the mask layer 105 including the absorption layer 103 and the reflection layer 104 are provided for each pixel 115 over the substrate 111 is illustrated in FIG. 2. Note that the organic material layer 106 is formed over the mask layer 105 also in a region where it is not illustrated.

As mentioned above, examples of the transfer layer 112 include a carrier transport layer and a carrier injection layer, and the optimum thickness thereof varies among pixels for red (R), green (G), and blue (B). A deposition method for varying a thickness of a film among pixels for different colors is described with reference to FIGS. 3A and 3B and FIGS. 4A to 4C.

In the case where the thicknesses of transfer layers 112 for red (R), green (G), and blue (B) pixels are set at a ratio of r:g:b, the areas of the absorption layers 103 in the mask layer 105R, the mask layer 105E and the mask layer 105B may be set at a ratio of r:g:b. Note that the overall area P of the absorption layer 103 and the reflection layer 104 does not vary among pixels for different colors. In addition, one of r, g, and b may be 0.

If needed, when another kind of color, such as cyan (C), magenta (M), or yellow (Y), is used in addition to red (R), green (G), and blue (B), or when the thicknesses of the transfer layers 112 are changed in accordance with the functions of the pixels, the ratio of the area of the absorption layer 103 may be changed while the overall area P of the absorption layer 103 and the reflection layer 104 is unchanged.

For example, assuming the thickness of a transfer layer of a red (R) pixel 115R is 100% and the thickness of a transfer layer of a blue (B) pixel 115B is 0%, a method for depositing a transfer layer of a green (G) pixel 115G to a thickness of 30% is described.

Figure 3A:
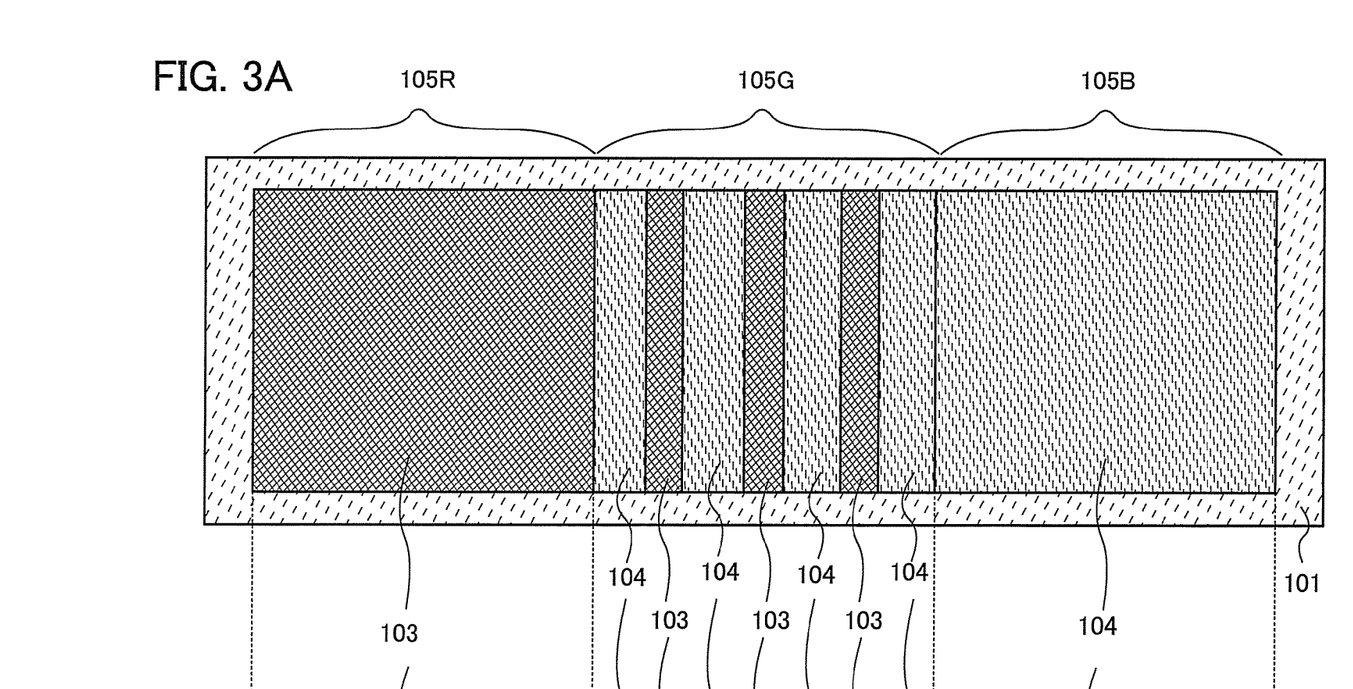
FIGS. 3A and 3B are a top view and a cross-sectional view illustrating a deposition method.
Figure 3B:
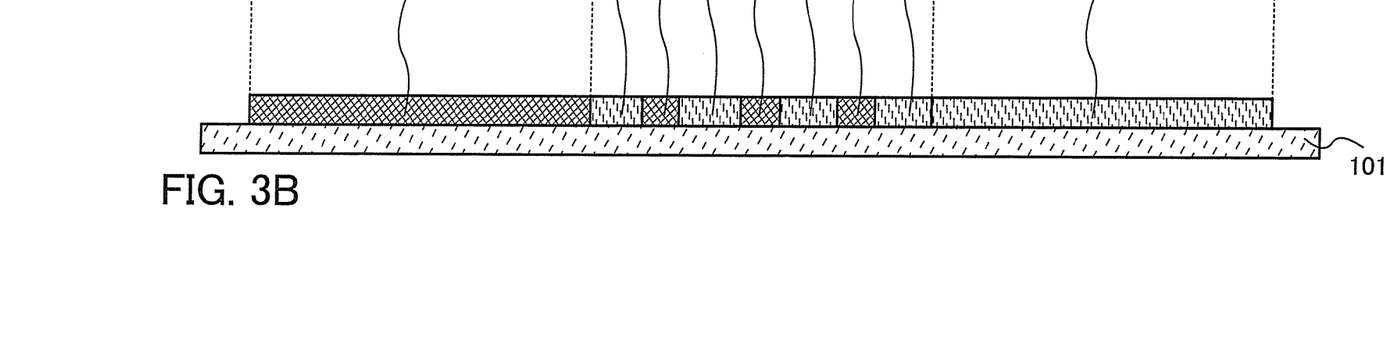

A top view in the case where the mask layer 105R, the mask layer 1056 and the mask layer 105B, which correspond to the red (R) pixel 115R, the green (G) pixel 115G and the blue (B) pixel 115B, respectively, are formed over the substrate 101 is illustrated in FIG. 3A and a cross-sectional view is illustrated in FIG. 3B.

The mask layer 105R is formed only with the absorption layer 103. The mask layer 105G is formed such that the area of the absorption layer 103 is 30% of the overall area of the absorption layer 103 and the reflection layer 104. The mask layer 105B is formed only with the reflection layer 104.

Figure 4A:
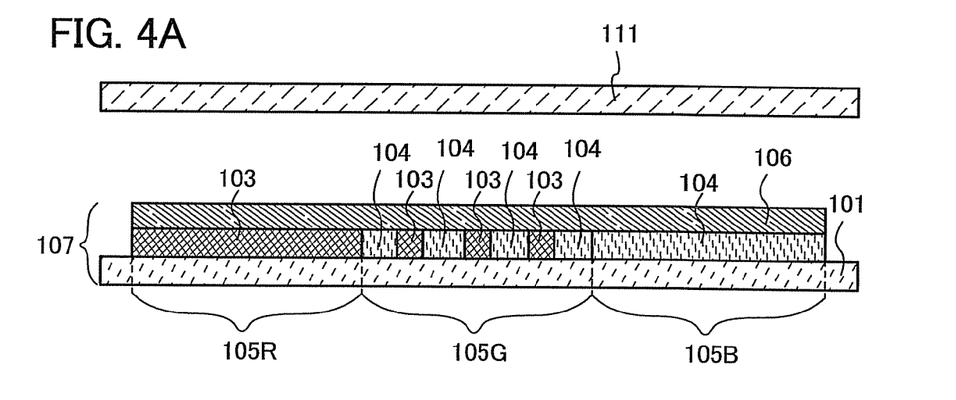
FIGS. 4A to 4C are cross-sectional views illustrating a deposition method.
Figure 4B:
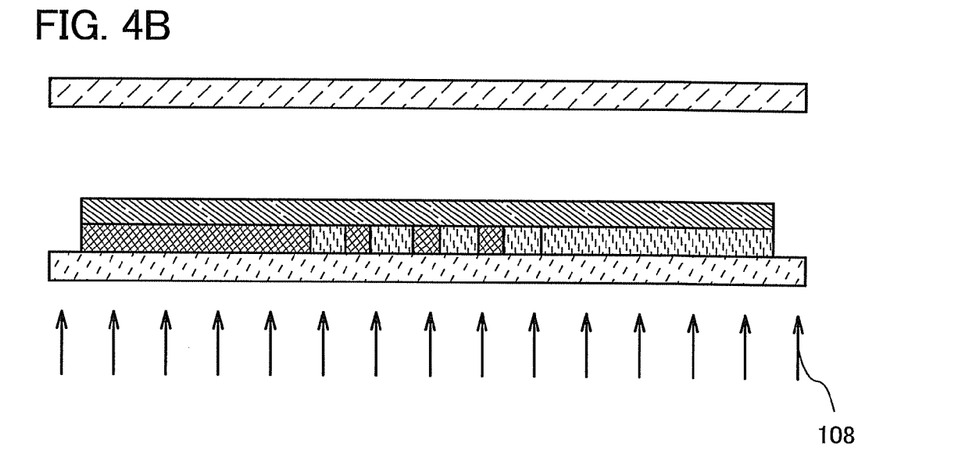

The organic material layer 106 is fowled over an entire surface of the mask layer 105R, the mask layer 105G and the mask layer 105B, and a side of the substrate 101 on which the organic material layer 106 is formed is disposed to face the substrate 111 (see FIG. 4A).

In a manner similar to the manufacturing step of FIG. 1B, irradiation with light 108 is performed from a side of the substrate 101 opposite to the side on which the organic material layer 106 is formed. As the light 108, a laser beam, for example, is used for the irradiation (see FIG. 4B). Accordingly, a portion of the organic material layer 106 over the absorption layer 103 is sublimated, whereas a portion of the organic material layer 106 over the reflection layer 104 is not sublimated.

Figure 4C:
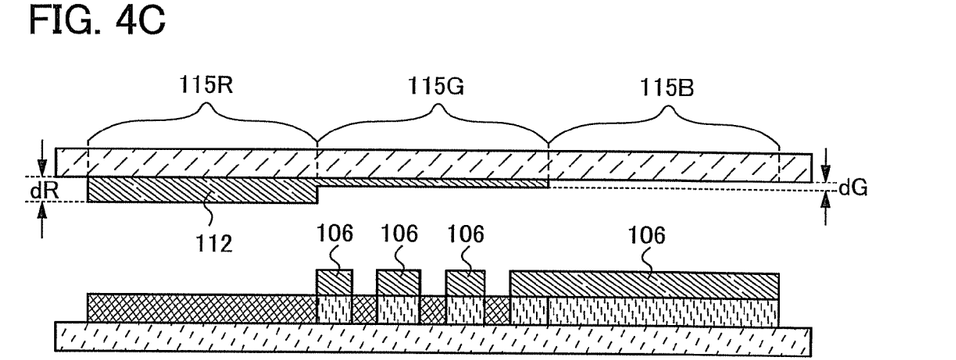

Through the aforementioned manufacturing process, assuming the thickness dR of the transfer layer 112 in the red (R) pixel 115R is 100% and the thickness of the transfer layer 112 in the blue (B) pixel 115B is 0%, the transfer layer 112 in the green (G) pixel 115G can be deposited to a thickness dG of 30% (see FIG. 4C).

According to this embodiment, an organic material layer for red (R), green (G), and blue (B) is evenly formed over a donor substrate and can easily be transferred to an element formation substrate as transfer layers for red (R), green (G), and blue (B) with different thicknesses.

In order to manufacture a light-emitting device according to this embodiment, a first electrode which is one of an anode and a cathode is formed in advance over the substrate 111, a light-emitting layer is formed, and at least one of a hole transport layer, a hole injection layer, an electron transport layer, and an electron injection layer is formed by the aforementioned method. After that, a second electrode which is the other of the anode and the cathode is formed. Thus, a light-emitting device can be manufactured.

The light-emitting layer is a layer that contains a light-emitting material. The light-emitting layer may be either a so-called light-emitting layer of a single film including an emission center material as its main component or a so-called light-emitting layer of a host-guest type in which an emission center material is dispersed in a host material.

There is no limitation on an emission center material used, and a known material that provides fluorescence or phosphorescence can be used. A fluorescent light-emitting material is, for example, N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), or another material having an emission wavelength of 450 nm or more, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), N,N,N',N',N'',N''',N'''',N''''-octaphenyldibenzo[g,p]chrysene-2,7,10,15-tetramine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), {2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), or 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). A phosphorescent light-emitting material is, for example, bis[2-(4',6'-difluorophenyl)pyridinato-N,$C^{2'}$]iridium(III) tetrakis(1-pyrazolyl)borate (abbreviation: FIr6) or another material having an emission wavelength of 470 nm to 500 nm, such as bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N,$C^{2'}$]iridium(III) picolinate (abbreviation: Ir($CF_3$ ppy)$_2$(pic)), or bis[2-(4',6'-difluorophenyl)pyridinato-N,$C^{2'}$]iridium(III) acetylacetonate (abbreviation: Fir (acac)), or another material having an emission wavelength of 500 nm (green light emission) or more, such as tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$(acac)), bis[2-(2'-benzo[4,5-a]thienyl)pyridinato-N,$C^{3'}$]iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (2,3,7,8,12,13,17,18-octaethyl-21H,23H-porphine) platinum(II) (abbreviation: PtOEP), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)). The light-emitting material can be selected from the above-mentioned materials or other known materials in consideration of emission color of each light-emitting element.

In the case of using a host material, the host material is, for example, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ), a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), or 9-[4-(5-phenyl-1,3,4-oxadiazol-2-yl)phenyl]-9H-carbazole (abbreviation: CO11), or an aromatic amine compound such as NPB (or α-NPD), TPD, or BSPB. Alternatively, a condensed polycyclic aromatic compound such as an anthracene derivative, a phenanthrene derivative, a pyrene derivative, a chrysene derivative, or a dibenzo[g,p]chrysene derivative can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), or the like can be used. From these materials or other known materials, a material may be selected which has a larger energy gap (or a triplet energy if the material provides phosphorescence) than an emission center material dispersed in the material and which has a transport property as needed for each layer.

In a light-emitting device, either an anode or a cathode or both need to be formed with a conductive film having a light-transmitting property. In the case where a conductive film having a light-transmitting property is formed as either the anode or the cathode below a light-emitting layer and at least one of a hole transport layer, a hole injection layer, an electron transport layer, and an electron injection layer (such layers are hereinafter referred to as an "EL layer") and a conductive film having a light-blocking property is formed as the other above the EL layer, a bottom-emission light-emitting device is obtained. On the other hand, in the case where a conductive film having a light-blocking property is formed as either the anode or the cathode below an EL layer and a conductive film having a light-transmitting property is formed as the other above the EL layer, a top-emission light-emitting device is obtained. In the case where both the anode and the cathode are formed with conductive films having a light-transmitting property, a dual-emission light-emitting device is obtained.

As a material of an anode having a light-transmitting property, a conductive metal oxide film of indium oxide ($In_2O_3$), an alloy of indium oxide and tin oxide ($In_2O_3$—$SnO_2$) (indium tin oxide (ITO)), indium tin oxide containing silicon or silicon oxide, indium zinc oxide (IZO), indium oxide containing tungsten oxide and zinc oxide, an alloy of indium oxide and zinc oxide ($In_2O_3$—ZnO), zinc oxide (ZnO), zinc oxide to which gallium (Ga) is added (ZnO:Ga) in order to increase conductivity or visible light transmissivity, or the like can be used.

A film of any of these materials may be formed by a sputtering method, a vacuum evaporation method, a sol-gel method, or the like.

For example, a film of indium zinc oxide (IZO) can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

When a cathode having a light-transmitting property is formed, an extremely thin film of a material with a low work function, such as aluminum, can be used. Alternatively, a stacked structure of a thin film of such a material and the above-mentioned conductive film having a light-transmitting property can be employed.

When the electron injection layer is provided between the cathode and the aforementioned electron transport layer, the cathode can be formed using any of a variety of conductive materials having a light-transmitting property, such as ITO or indium tin oxide containing silicon or silicon oxide, regardless of its work function. A film of any of these conductive materials can be formed by a sputtering method, an inkjet method, a spin coating method, or the like.

When a conductive film having a light-blocking property is used as a cathode, a metal, an alloy, an electrically conductive compound, a mixture thereof, or the like with a low work function (specifically, 3.8 eV or less) can be used. Specific examples of such a cathode material are as follows: an element that belongs to Group 1 or Group 2 of the periodic table, i.e., an alkali metal such as lithium (Li) or cesium (Cs), an alkaline earth metal such as magnesium (Mg), calcium (Ca), or strontium (Sr), an alloy containing these (such as MgAg or AlLi), a rare earth metal such as europium (Eu) or ytterbium (Yb), an alloy containing these, and the like.

When a conductive film having a light-blocking property is used as an anode, a metal, an alloy, a conductive compound, a mixture thereof, or the like with a high work function (specifically, 4.0 eV or more) is preferably used.

For example, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used. By providing any of the above-mentioned composite materials in contact with the anode, an electrode material can be selected regardless of its work function.

This application is based on Japanese Patent Application Ser. no. 2008-318365 filed with Japan Patent Office on Dec. 15, 2008, the entire contents of which are hereby incorporated by reference.

What is claimed is:

1. A deposition method comprising the steps of:
   forming a first mask layer including a first absorption layer and a first reflection layer and a second mask layer including a second absorption layer and a second reflection layer over a first substrate;
   forming an organic material layer over the first mask layer and the second mask layer;
   disposing the organic material layer of the first substrate and a deposition surface of a second substrate so as to face each other; and
   depositing a first transfer layer to a first pixel corresponding to the first mask layer and a second transfer layer to a second pixel corresponding to the second mask layer, over the second substrate by sublimating the organic material layer over the first absorption layer and the second absorption layer by irradiation with light from a side of the first substrate which is opposite to a side on which the organic material layer is formed,
   wherein a thickness of the first transfer layer and a thickness of the second transfer layer are different and proportional to the ratio of the area of the first absorption layer to the first reflection layer and the ratio of the area of the second absorption layer to the second reflection layer respectively.

2. The deposition method according to claim 1, further comprising the steps of:
   forming a first electrode which is one of an anode and a cathode over the second substrate before depositing the first transfer layer and the second transfer layer;
   forming a light-emitting layer over the first transfer layer and the second transfer layer; and
   forming a second electrode which is the other of the anode and the cathode over the light-emitting layer.

3. The deposition method according to claim 1, wherein each of the first absorption layer and the second absorption layer is formed of a single material selected from molybdenum, tantalum nitride, titanium, tungsten, and carbon.

4. The deposition method according to claim 1, wherein each of the first reflection layer and the second reflection layer is formed of a single material selected from aluminum, silver, gold, platinum, copper, an alloy including aluminum, and an alloy including silver.

5. The deposition method according to claim 1, wherein the light is a laser beam.

6. The deposition method according to claim 1, wherein a width of the first reflection layer is wider than that of the second reflection layer, and
   wherein a distance between the organic material layer and the second substrate is longer than the width of the first reflection layer.

7. A deposition method comprising the steps of:
   forming an organic material layer over a first substrate having a first mask layer including a first absorption layer and a first reflection layer and a second mask layer including a second absorption layer and a second reflection layer, wherein the first absorption layer and the second absorption layer have different areas;
   disposing the organic material layer of the first substrate and a deposition surface of a second substrate so as to face each other; and
   depositing a first transfer layer to a first pixel corresponding to the first mask layer and a second transfer layer to a second pixel corresponding to the second mask layer, over the second substrate by sublimating the organic material layer over the first absorption layer and the second absorption layer by irradiation with light from a side of the first substrate which is opposite to a side on which the organic material layer is formed, wherein a thickness of the first transfer layer and a thickness of the second transfer layer are different and proportional to the ratio of the area of the first absorption layer to the first reflection layer and the ratio of the area of the second absorption layer to the second reflection layer respectively.

8. The deposition method according to claim 7, further comprising the steps of:

forming a first electrode which is one of an anode and a cathode over the second substrate before depositing the first transfer layer and the second transfer layer;

forming a light-emitting layer over the first transfer layer and the second transfer layer; and forming a second electrode which is the other of the anode and the cathode over the light-emitting layer.

9. The deposition method according to claim 7, wherein each of the first absorption layer and the second absorption layer is formed of a single material selected from molybdenum, tantalum nitride, titanium, tungsten, and carbon.

10. The deposition method according to claim 7, wherein each of the first reflection layer and the second reflection layer is formed of a single material selected from aluminum, silver, gold, platinum, copper, an alloy including aluminum, and an alloy including silver.

11. The deposition method according to claim 7, wherein the light is a laser beam.

12. The deposition method according to claim 7, wherein a width of the first reflection layer is wider than that of the second reflection layer, and wherein a distance between the organic material layer and the second substrate is longer than the width of the first reflection layer.

13. A deposition method comprising the steps of:

disposing a first substrate having a first mask layer including a first absorption layer and a first reflection layer and a second mask layer including a second absorption layer and a second reflection layer and a deposition surface of a second substrate so as to face each other, wherein the first absorption layer and the second absorption layer have different areas and an organic material layer is formed over the first mask layer and the second mask layer; and depositing a first transfer layer to a first pixel corresponding to the first mask layer and a second transfer layer to a second pixel corresponding to the second mask layer, over the second substrate by sublimating the organic material layer over the first absorption layer and the second absorption layer by irradiation with light from a side of the first substrate which is opposite to a side on which the organic material layer is formed, wherein a thickness of the first transfer layer and a thickness of the second transfer layer are different and proportional to the ratio of the area of the first absorption layer to the first reflection layer and the ratio of the area of the second absorption layer to the second reflection layer respectively.

14. The deposition method according to claim 13, further comprising the steps of:

forming a first electrode which is one of an anode and a cathode over the second substrate before depositing the first transfer layer and the second transfer layer;

forming a light-emitting layer over the first transfer layer and the second transfer layer; and forming a second electrode which is the other of the anode and the cathode over the light-emitting layer.

15. The deposition method according to claim 13, wherein each of the first absorption layer and the second absorption layer is formed of a single material selected from molybdenum, tantalum nitride, titanium, tungsten, and carbon.

16. The deposition method according to claim 13, wherein each of the first reflection layer and the second reflection layer is formed of a single material selected from aluminum, silver, gold, platinum, copper, an alloy including aluminum, and an alloy including silver.

17. The deposition method according to claim 13, wherein the light is a laser beam.

18. The deposition method according to claim 13, wherein a width of the first reflection layer is wider than that of the second reflection layer, and wherein a distance between the organic material layer and the second substrate is longer than the width of the first reflection layer.

* * * * *